(12) United States Patent
Riviere et al.

(10) Patent No.: US 10,998,470 B2
(45) Date of Patent: May 4, 2021

(54) COVER FOR AN ELECTRONIC CIRCUIT PACKAGE

(71) Applicant: STMICROELECTRONICS (GRENOBLE 2) SAS, Grenoble (FR)

(72) Inventors: Jean-Michel Riviere, Froges (FR); Romain Coffy, Voiron (FR); Karine Saxod, Les Marches (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 16/218,906

(22) Filed: Dec. 13, 2018

(65) Prior Publication Data

US 2019/0189859 A1    Jun. 20, 2019

(30) Foreign Application Priority Data

Dec. 15, 2017 (FR) ..................................... 1762268

(51) Int. Cl.
| | |
|---|---|
| *H01L 33/48* | (2010.01) |
| *H01L 33/00* | (2010.01) |
| *H01L 33/58* | (2010.01) |
| *H05K 5/03* | (2006.01) |
| *H01L 31/12* | (2006.01) |
| *H01L 31/0232* | (2014.01) |
| *H01L 31/0203* | (2014.01) |
| *H01L 31/18* | (2006.01) |
| *H01L 31/16* | (2006.01) |

(52) U.S. Cl.
CPC ........ *H01L 33/483* (2013.01); *H01L 31/0203* (2013.01); *H01L 31/02327* (2013.01); *H01L 31/12* (2013.01); *H01L 31/162* (2013.01); *H01L 31/18* (2013.01); *H01L 33/005* (2013.01); *H01L 33/58* (2013.01); *H05K 5/03* (2013.01)

(58) Field of Classification Search
CPC .............................. H01L 33/483; H01L 33/58
See application file for complete search history.

(56) References Cited

U.S. PATENT DOCUMENTS

| | | | |
|---|---|---|---|
| 6,531,341 B1 | 3/2003 | Peterson et al. | |
| 7,612,383 B2* | 11/2009 | Andrews | ................. H01L 33/58 257/436 |
| 7,760,332 B2 | 7/2010 | Yamaguchi | |
| 7,848,639 B2 | 12/2010 | Kinoshita | |
| 9,519,109 B2 | 12/2016 | Sakai et al. | |
| 9,831,357 B2 | 11/2017 | Jin et al. | |
| 9,893,259 B2* | 2/2018 | Kim | ........................ H01L 33/58 |
| 9,971,060 B2 | 5/2018 | Weng et al. | |
| 10,304,793 B2 | 5/2019 | Lu et al. | |
| 2002/0145676 A1 | 10/2002 | Kuno et al. | |
| 2004/0067015 A1 | 4/2004 | Nakajima | |
| 2004/0094825 A1 | 5/2004 | Onishi et al. | |
| 2005/0270403 A1 | 12/2005 | Adachi et al. | |
| 2006/0091487 A1* | 5/2006 | Hanada | ................... H01L 24/03 257/432 |
| 2008/0001241 A1 | 1/2008 | Tuckerman et al. | |

(Continued)

FOREIGN PATENT DOCUMENTS

WO    2016010425 A1    1/2016

*Primary Examiner* — Eugene Lee
(74) *Attorney, Agent, or Firm* — Seed Intellectual Property Law Group LLP

(57) ABSTRACT

A cover for an electronic circuit package, including an element having peripheral portions housed in an inner groove of a through opening.

17 Claims, 2 Drawing Sheets

(56) References Cited

U.S. PATENT DOCUMENTS

| | | |
|---|---|---|
| 2008/0002460 A1 | 1/2008 | Tuckerman et al. |
| 2008/0150065 A1 | 6/2008 | Oda |
| 2008/0175605 A1 | 7/2008 | Sakurai |
| 2009/0021842 A1 | 1/2009 | Berge et al. |
| 2009/0212306 A1 | 8/2009 | Bogner et al. |
| 2009/0269075 A1 | 10/2009 | Wong et al. |
| 2011/0248152 A1 | 10/2011 | Svajda et al. |
| 2011/0260176 A1 | 10/2011 | Onoe et al. |
| 2012/0056217 A1* | 3/2012 | Jung .................. H01L 25/0753 257/89 |
| 2012/0091500 A1* | 4/2012 | Matoba ................ H01L 33/486 257/99 |
| 2012/0104454 A1 | 5/2012 | Coffy |
| 2012/0242884 A1 | 9/2012 | Ishiguro et al. |
| 2014/0084322 A1* | 3/2014 | Park ..................... H01L 33/486 257/98 |
| 2014/0361200 A1 | 12/2014 | Rudmann et al. |
| 2015/0138436 A1 | 5/2015 | Wong |
| 2015/0243802 A1* | 8/2015 | Fujimoto .......... H01L 31/02327 257/82 |
| 2015/0325613 A1 | 11/2015 | Rudmann et al. |
| 2015/0340351 A1 | 11/2015 | Rossi et al. |
| 2016/0025855 A1 | 1/2016 | Camarri et al. |
| 2016/0216138 A1 | 7/2016 | Rudmann et al. |
| 2016/0293585 A1 | 10/2016 | Geiger |
| 2017/0038459 A1 | 2/2017 | Kubacki et al. |
| 2017/0113922 A1 | 4/2017 | Huang et al. |
| 2017/0213940 A1 | 7/2017 | Sakai et al. |
| 2018/0006003 A1 | 1/2018 | Nagarajan et al. |
| 2018/0190858 A1 | 7/2018 | Lin et al. |
| 2018/0331236 A1 | 11/2018 | Luan et al. |
| 2019/0139947 A1 | 5/2019 | Saxod et al. |
| 2019/0189860 A1 | 6/2019 | Riviere et al. |
| 2019/0190606 A1 | 6/2019 | Riviere et al. |
| 2020/0127156 A1 | 4/2020 | Camarri et al. |

* cited by examiner

COVER FOR AN ELECTRONIC CIRCUIT PACKAGE

BACKGROUND

Technical Field

The present disclosure generally relates to the field of electronic circuits, and more particularly to covers and methods of forming of covers for integrated circuit packages.

Description of the Related Art

Certain electronic packages comprise an electronic chip housed in a package. Such a package often comprises a support portion having the chip affixed thereto, and a cover portion covering the chip.

When the electronic circuit is an optical signal transmit and/or receive circuit, such as a time-of-flight measurement proximity sensor, the electronic chip comprises optical signal transmit and receive regions. The cover then comprises, opposite the transmit/receive regions, elements transparent for the wavelengths of the optical signals, for example, made of glass, such as lenses.

Similarly, in various other types of electronic circuits, elements are positioned in the cover.

BRIEF SUMMARY

One or more embodiments are directed to a cover for an electronic circuit package, comprising an element having peripheral portions housed in an inner groove of a through opening.

According to an embodiment, said element is transparent, filtering, or comprises a lens.

According to an embodiment, the cover comprises a body covered with a cap.

According to an embodiment, the body and the cap are glued to each other.

According to an embodiment, the opening is flared, from the groove, on the side of the cap.

According to an embodiment, the cap has rounded shapes on a surface opposite to the body.

According to an embodiment, the groove is located in the body.

According to an embodiment, the groove is delimited by the body and the cap.

An embodiment provides an optical transmission and/or reception electronic circuit comprising the above cover.

An embodiment provides a method of manufacturing the above cover.

According to an embodiment, the method comprises a step of manufacturing the cap by molding.

According to an embodiment, the molding is film-assisted.

According to an embodiment, the method comprises a step a) of installing said elements in the portions of the grooves located in the body.

According to an embodiment, the method comprises, after step a), a step of gluing the cap onto the body.

According to an embodiment, the method comprises, after step a), a step of manufacturing the cap by molding on the body.

The foregoing and other features and advantages will be discussed in detail in the following non-limiting description of specific embodiments in connection with the accompanying drawings.

DETAILED DESCRIPTION

Figure 1:
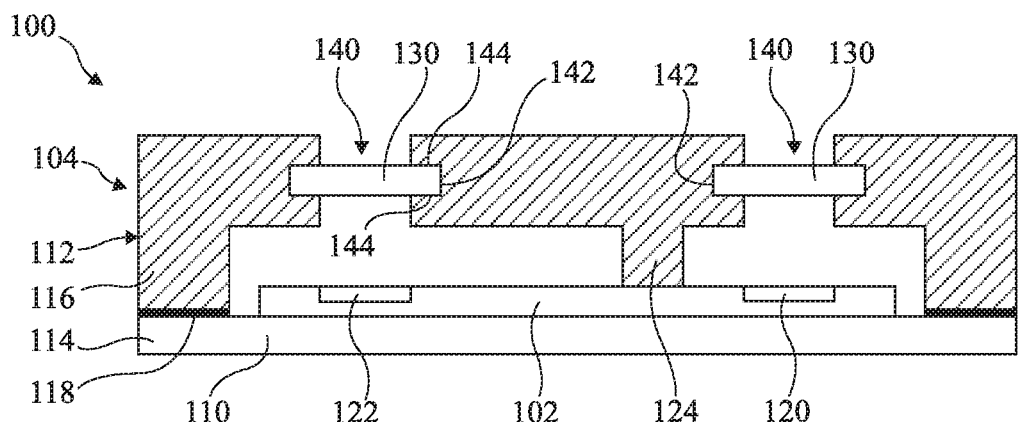
FIG. 1 is a cross-section view of an embodiment of an electronic circuit.

The same elements have been designated with the same reference numerals in the various drawings and, further, the various drawings are not to scale. For clarity, only those steps and elements which are useful to the understanding of the described embodiments have been shown and are detailed. In particular, the electronic chip and the package elements other than the cover are not detailed, the described embodiments being compatible with most current electronic packages and chips.

In the following description, when reference is made to terms qualifying absolute positions, such as terms "front," "rear," "top," "bottom," "left," "right," etc., or relative positions, such as terms "above," "under," "upper," "lower," etc., or to terms qualifying directions, such as terms "horizontal," "vertical," etc., it is referred to the orientation of the drawings, it being understood that, in practice, the described devices may be oriented differently. Unless otherwise specified, expressions "approximately," "substantially," and "in the order of" mean to within 10%, preferably to within 5%.

FIG. 1 is a cross-section view of an embodiment of an electronic circuit 100. Electronic circuit 100 comprises an electronic chip 102 housed in a package 104. The electronic chip 102 includes semiconductor material with one or more integrated circuits as is well known in the art.

Package 104 comprises a stacked support 110 and cover 112. Chip 102 is arranged on a central portion of support 110, in a closed space delimited by support 110 and cover 112. Support 110 and cover 112 have peripheral portions 114 and 116 which are mechanically connected, typically by glue 118.

As an example, chip 102 comprises an optical transmission region 120 and an optical reception region 122. Optical transmission/reception regions 120 and 122 are for example separated by an opaque wall 124 of the cover. Optical transmission/reception regions 120 and 122 are opposite transparent elements 130 housed in openings 140 extending through cover 112.

More generally, according to the type of electronic circuit, one or a plurality of elements of any type may be provided instead of the two transparent elements 130 of this example.

To hold each element 130 in place in the concerned opening 140, peripheral portions of element 130 are housed in an inner groove 142 in the opening. Groove 142 is delimited on both sides by two shoulders 144, that is, variations of the opening dimensions, arranged face to face.

Shoulders 144 are present on either side of element 130, which holds element 130 in place.

The fact of providing such a groove 142 for each element enables to avoid gluing element 130 in opening 140. The cover is thereby particularly easy to form. Particularly, there is no risk of glue overflow capable of disturbing the function of element 130, for example, of disturbing the transmission of optical signals.

Figure 2:
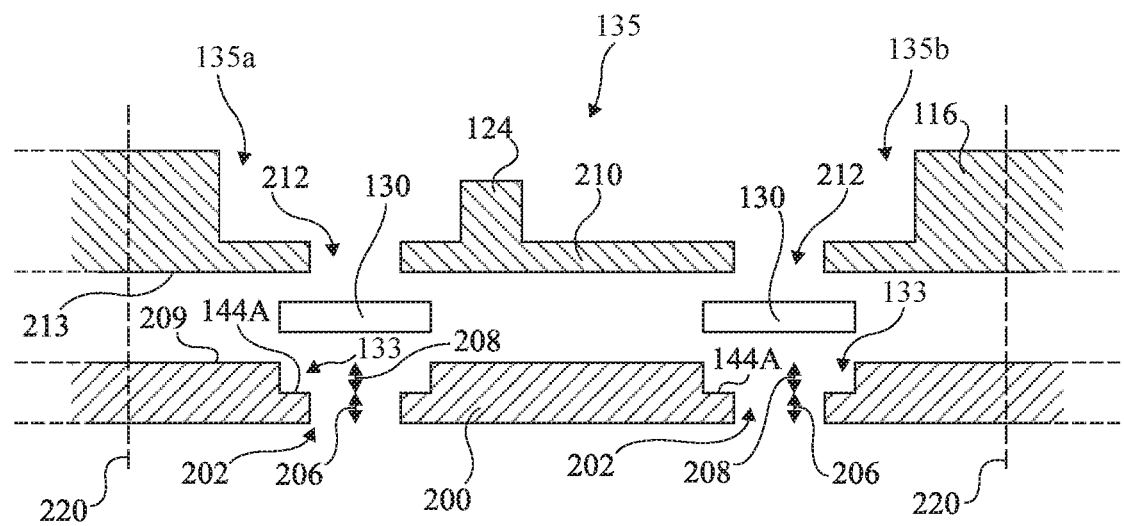
FIG. 2 is an exploded cross-section view illustrating an embodiment of a method of manufacturing an electronic circuit cover.

FIG. 2 is an exploded cross-section view illustrating an embodiment of a method of manufacturing an electronic circuit cover.

It is started by separately forming a first body, such as body 200 and a second body, such as a cap 210.

Body 200 is crossed by one or a plurality of openings, for example, two openings 202. Each of through openings 202 has an upward-facing shoulder 144A at a first recess 133, between respectively lower and upper portions 206 and 208 of the opening. Upper surface 209 of body 200 is for example planar.

Cap 210 is crossed by one or a plurality of openings 212, each intended to be located opposite one of opening 202. Each through opening 212 has a horizontal dimension smaller than that of the corresponding portion 208 to define groove 142. As an example, each opening 212 has the same dimensions as portion 206 of the corresponding opening 202. The cap 210 has a second recess 135, which may form two distinct recesses 135a and 135b to form distinct cavities when coupled to the support 110 in FIG. 1. The cap has a surface 213, for example, planar, intended to be in contact with surface 209 of the body.

In the shown example, cap 210 comprises, on the side opposite to its surface 213, peripheral portions 116 intended to be glued to the peripheral portions of a support of the type of support 110 of the package of FIG. 1, and partition 124 intended to rest on the chip. As a variation, peripheral portions 116 and partition 124 are formed on body 200.

Body 200 and cap 210 are for example formed by molding. As an example, the body and/or the cap are made of thermosetting polymers. For example, body 200 and cap 210 are extended to the right and to the left by bodies and caps of other electronic circuit covers, for example, identical, which are simultaneously manufactured. The assembly of the bodies and the assembly of the caps then each form a plate where the bodies and the caps are for example arranged in an array.

At a step subsequent to the manufacturing of the body and of the cap, an element 130 is arranged in portion 208 of each opening 202, by placing of a peripheral portion of element 130 against shoulder 144A.

The depths of portions 208 are for example provided so that elements 130 once in place are flush with surface 209 of the body. As an example, each element 130 has a thickness in the range from 100 µm to 400 µm and the associated portion 208 then has a depth substantially equal to this thickness. As a variation, each element 130 has a thickness greater than this depth and protrudes from surface 209.

Then, cap 210 is placed against surface 209 of body 200, and the body is mechanically connected to the cap, for example, by adhesive, such as by gluing. It may be provided to form the mechanical connection between the cap and the body in any other way, for example, by snapping, by nesting, etc. It may further be provided for the cap to totally or partially cover the body, for example, partially around the openings.

In the example of a simultaneous manufacturing of a plurality of covers, the neighboring covers are then separated by sawing, along lines 220.

Figure 3:
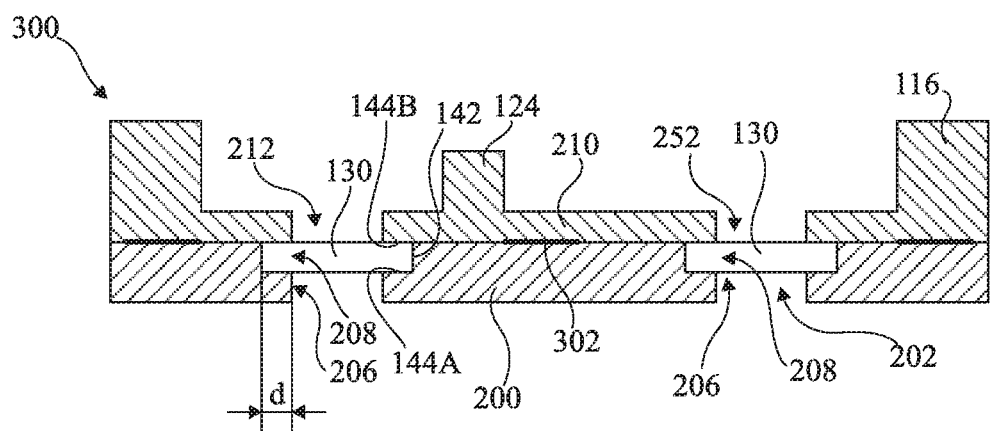
FIG. 3 is a cross-section view of an embodiment of an electronic circuit cover obtained by the method of FIG. 2.

A cover such as that illustrated in FIG. 3 is then obtained.

FIG. 3 is a cross-section view of an embodiment of an electronic circuit cover 300 obtained by the method of FIG. 2, in the example where cap 210 is glued to body 200 by glue 302.

Elements 130 are located in through openings, each formed of an opening 202 and of an opening 212. The variation of horizontal dimensions between portion 208 of opening 202 and opening 212 forms a shoulder 144B. The two shoulders 144A and 144B delimit a groove 142. Peripheral portions of element 130 are housed in groove 142, between shoulders 144A and 144B.

As mentioned, element 130 may be held in place without glue. A gluing of elements 130 in body 200 may also be provided before installing cap 210, to ease the installation of the cap without risking for one of elements 130 to move. In this case, the quantity of glue is much smaller than that which would be necessary to hold elements 130 in place if they did not have their peripheral portions housed in grooves 142. Thereby, the cover is particularly easy to manufacture with no risk due to the use of a large amount of glue.

It may be provided for the dimensions of portion 208 of each opening to be adjusted, to within a functional clearance, to the dimensions of the associated element 130. The functional clearance is for example in the range from 2 µm to 15 µm Elements 130 have horizontal dimensions, for example, diameters in the case of circular elements 130, or for example side lengths in the case of rectangular elements 130, for example in the range from 300 µm to 1 mm. This enables to set the positions of elements 130 with respect to openings 202. When the position of openings 202 is accurate, for example, when body 200 is obtained by molding, openings 202 resulting from raised portions in a mold, an accurate position of elements 130 in the cover can be obtained. This enables to avoid, in the electronic circuit, problems due to possible misalignments between elements 130 and the electronic chip.

Further, a particularly small groove depth corresponding to a difference d between the horizontal half-dimensions of the opening in groove 142 and next to the groove may be provided. The depth of groove 142 is for example in the range from 10 µm to 50 µm or is for example in the order of the thickness of elements 130, for example, in the order of 300 µm. It may then be provided for elements 130 to have decreased dimensions while keeping a same dimension useful, for example, for the passage of optical signals. This enables to decrease the general dimensions of the electronic circuit.

Figure 4:
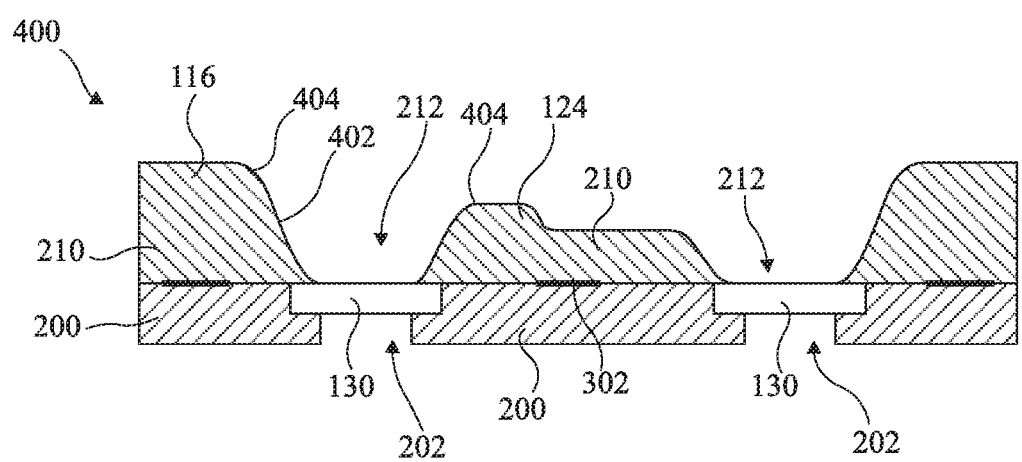
FIG. 4 is a cross-section view of another embodiment of an electronic circuit cover.

FIG. 4 is a cross-section view of another embodiment of an electronic circuit cover 400.

Cover 400 comprises elements identical or similar to those of cover 300 of FIG. 3, arranged identical or similarly, with the difference that openings 212 of cap 210 are flared from elements 130 and thus have flared portions 402. Further, the shapes of the cap surface opposite to the body, for example, peripheral portions 116 and partition 124, preferably are rounded shapes 404, for example, with radiuses of curvature greater than 10 µm.

Cap 210 may be manufactured by molding. Preferably, the molding is assisted by a mold release film. During the film-assisted molding, the walls of a mold are covered with a film before forming cap 210. After the molding, the film covers the surface of cap 210, and the film is removed. The provision of flared portions 402 and/or of rounded shapes 404 enables to decrease risks of film breakage during the molding.

Specific embodiments have been described. Various alterations, modifications, and improvements will occur to those skilled in the art. In particular, each of the grooves may be astride between the body and the cap. For this purpose, it may for example be provided for the peripheral portions of element 130 to be located between a shoulder in the opening extending through the body, and a shoulder in the opening extending through the cap. The groove portion comprised in the body and the groove portion comprised within the cap may have different horizontal dimensions, the horizontal dimensions of the portion located in the cap being for example greater than those of the portion located in the body.

Further, although examples applied to transparent elements 130 have been described, all the described embodiments more generally apply to any element housed in a cover for which the same problems are posed, particularly elements comprising lenses, for example, for focusing optical signals, or filtering elements enabling to remove all or part of optical radiations having wavelengths different from those of optical signals transmitted or received by the integrated circuit.

Finally, the practical implementation of the described embodiments is within the abilities of those skilled in the art based on the functional indications given hereabove.

Such alterations, modifications, and improvements are intended to be part of this disclosure, and are intended to be within the spirit and the scope of the present invention. The various embodiments described above can be combined to provide further embodiments. These and other changes can be made to the embodiments in light of the above-detailed description. Accordingly, the foregoing description is by way of example only and is not intended to be limiting. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic optical transmitting and receiving device, comprising:
   a semiconductor chip comprising an optical component; and
   a housing around the semiconductor chip, the housing including a cover having a first body coupled to a second body, the first body including a first through opening and the second body including a second through opening, the second through opening being aligned with the first through opening, the first and the second bodies forming an inner groove at the first through opening; and
   an optical element in the first through opening, the optical element having peripheral portions positioned in the inner groove and held in the inner groove by the first and second bodies,
   wherein the first and second bodies include first and second surfaces, wherein the first surface of the first body includes a first recess and the second surface of the second body includes a second recess, wherein the first surface of the first body is coupled to the first surface of the second body, wherein the first recess and the first surface of the second body form the inner groove at the first through opening.

2. The electronic optical transmit and receive device of claim 1, wherein the first and second bodies are made of molding material.

3. The electronic optical transmit and receive device of claim 1, wherein the first body is coupled to the second body by glue.

4. A method of manufacturing a transmitting and receiving device, the method comprising:
   forming a first body having a first surface and a second surface, the first body including a through opening from the first surface to the second surface, the first surface of the first body including a first recess at the through opening and including an optical element in the first recess;
   forming a second body having a first surface and a second surface, the second body including a through opening from the first surface to the second surface, the second surface of the second body including a second recess;
   coupling the first surface of the first body to the first surface of the second body to form a cover, wherein the coupling causes peripheral portions of the optical element to be held in position between the first and second bodies at the first recess;
   coupling a semiconductor die to a substrate, the semiconductor die including a transmitting element and a receiving element; and
   coupling the cover to the substrate so that the cover covers the semiconductor die and is located in the second recess of the second body.

5. The method of claim 4, wherein forming the second body comprises forming the second body in a molding process.

6. The method of claim 5, wherein the molding process includes using a mold release film.

7. The method of claim 4, wherein the optical element is held in position by the first and second bodies being coupled together.

8. The method of claim 4, wherein coupling the first surface of the first body to the first surface of the second body includes using glue to couple the first surface of the first body to the first surface of the second body.

9. The method of claim 8, wherein the glue does not contact the optical element.

10. The method of claim 4, wherein forming the second body occurs after the optical element is placed in the first recess, wherein forming the second body comprises molding the second body on the first surface of the first body.

11. The method of claim 4, wherein the optical element includes at least one of a transparent material, a filter, and a lens.

12. An electronic optical transmitting and receiving device, comprising:
   one or more semiconductor dice having a transmitting region and a receiving region;
   a cover covering the one or more semiconductor dice, the cover including:
      a housing including a first body coupled to a second body, the first body including a first through opening and the second body including a second through opening, the first and second through openings being aligned with each other, the first and second bodies forming an inner groove at the first through opening, wherein a first surface of the first body includes a first recess at the first through opening, wherein the surface of the first body is coupled to a first surface of the second body to form the inner groove at the first recess, wherein a second surface of the second body includes a second recess; and an element in the first through opening, the element having peripheral portions positioned in the inner groove and held in the inner groove by the first and second bodies, wherein the one or more semiconductor dice are located in the second recess.

13. The electronic optical transmit and receive device of claim 12, wherein the element includes at least one of: a transparent material, a filter, and a lens.

14. The electronic optical transmit and receive device of claim 12, wherein the first body and the second body are glued together.

15. The electronic optical transmit and receive device of claim 14, wherein the glue is not in contact with the element.

16. The electronic optical transmit and receive device of claim 12, wherein the second through opening has walls that are tapered outwardly extending away from the element.

17. The electronic optical transmit and receive device of claim 12, wherein the second body has rounded shapes at a surface that is opposite to the first body.

\* \* \* \* \*